(12) United States Patent
Wu et al.

(10) Patent No.: US 8,164,089 B2
(45) Date of Patent: Apr. 24, 2012

(54) ELECTRONIC DEVICE

(75) Inventors: Yiliang Wu, Oakville (CA); Nan-Xing Hu, Oakville (CA); Ping Liu, Mississauga (CA); Hadi K. Mahabadi, Mississauga (CA); Paul Smith, Oakville (CA); Giuseppa Baranyi, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 149 days.

(21) Appl. No.: 12/575,739

(22) Filed: Oct. 8, 2009

(65) Prior Publication Data
US 2011/0084252 A1 Apr. 14, 2011

(51) Int. Cl.
*H01L 51/00* (2006.01)

(52) U.S. Cl. ........... 257/40; 257/E51.027; 257/E51.006; 438/99; 438/151; 438/158; 438/257; 438/478

(58) Field of Classification Search ........... 438/99, 438/151, 158, 257, 478; 257/40, E51.027, 257/E51.006
See application file for complete search history.

(56) References Cited

U.S. PATENT DOCUMENTS

| | | | |
|---|---|---|---|
| 6,107,117 A * | 8/2000 | Bao et al. | 438/99 |
| 6,180,956 B1 * | 1/2001 | Chondroudis et al. | 257/40 |
| 6,335,539 B1 * | 1/2002 | Dimitrakopoulos et al. | 257/40 |
| 6,821,911 B1 | 11/2004 | Lo et al. | |
| 6,838,198 B2 * | 1/2005 | Tallon | 428/702 |
| 7,132,500 B2 * | 11/2006 | Ong et al. | 528/373 |
| 7,368,510 B2 * | 5/2008 | Lee et al. | 525/355 |
| 7,517,719 B2 * | 4/2009 | Kugler et al. | 438/99 |
| 7,615,775 B2 * | 11/2009 | Wada et al. | 257/40 |
| 7,670,887 B2 * | 3/2010 | Bucher et al. | 438/158 |
| 7,767,999 B2 * | 8/2010 | Ong et al. | 257/40 |
| 7,815,818 B2 * | 10/2010 | Hsu et al. | 252/500 |
| 7,893,190 B2 * | 2/2011 | Park et al. | 528/373 |
| 7,897,963 B2 * | 3/2011 | Kim et al. | 257/40 |
| 2003/0186059 A1 | 10/2003 | Hirata et al. | |
| 2004/0241900 A1 * | 12/2004 | Tsukamoto et al. | 438/82 |
| 2005/0056828 A1 * | 3/2005 | Wada et al. | 257/40 |
| 2005/0127334 A1 * | 6/2005 | Shibata et al. | 252/502 |
| 2005/0159580 A1 * | 7/2005 | Liu et al. | 528/373 |
| 2005/0221530 A1 * | 10/2005 | Cheng et al. | 438/82 |
| 2006/0024860 A1 * | 2/2006 | Wada et al. | 438/99 |

(Continued)

FOREIGN PATENT DOCUMENTS
DE 10152939 B4 4/2008

(Continued)

OTHER PUBLICATIONS

Dan Li et al., Processable aqueous dispersions of graphene nanosheets, Nanotechnology, Feb. 2008, pp. 101-105, vol. 3, Nature Publishing Group.

(Continued)

*Primary Examiner* — N Drew Richards
*Assistant Examiner* — Ankush Singal
(74) *Attorney, Agent, or Firm* — Fay Sharpe LLP

(57) ABSTRACT

Electronic devices, such as organic thin film transistors, with improved mobility are disclosed. The semiconducting layer comprises layers or striations of an organic semiconductor and graphene, including alternating layers/striations of such materials. The organic semiconductor and graphene layers interact well together because both materials form lamellar sheets. The presence of graphene enhances mobility by correcting molecular packing defects in the organic semiconductor layers, and the conductivity of graphene can be controlled. Finally, both materials are flexible, allowing for flexible semiconductor layers and transistors.

4 Claims, 7 Drawing Sheets

U.S. PATENT DOCUMENTS

| | | | |
|---|---|---|---|
| 2006/0038299 A1* | 2/2006 | Hirakata et al. | 257/773 |
| 2006/0045838 A1* | 3/2006 | Lucien Malenfant et al. | 423/447.1 |
| 2006/0099732 A1* | 5/2006 | Miura et al. | 438/99 |
| 2006/0186502 A1* | 8/2006 | Shimotani et al. | 257/458 |
| 2007/0286953 A1 | 12/2007 | MacPherson et al. | |
| 2007/0298530 A1* | 12/2007 | Feehery | 438/46 |
| 2008/0048181 A1* | 2/2008 | Tanaka et al. | 257/40 |
| 2008/0087884 A1* | 4/2008 | Doi | 257/40 |
| 2008/0241594 A1* | 10/2008 | Doi | 428/704 |
| 2008/0283829 A1* | 11/2008 | Kim et al. | 257/40 |
| 2009/0017211 A1* | 1/2009 | Gruner et al. | 427/258 |
| 2009/0121216 A9* | 5/2009 | Han et al. | 257/40 |
| 2009/0127514 A1* | 5/2009 | Korkut et al. | 252/500 |
| 2009/0140236 A1* | 6/2009 | Wu et al. | 257/40 |
| 2009/0140237 A1* | 6/2009 | Wu et al. | 257/40 |
| 2009/0155963 A1 | 6/2009 | Hawkins et al. | |
| 2009/0206341 A1* | 8/2009 | Marks et al. | 257/66 |
| 2010/0019237 A1* | 1/2010 | Marks et al. | 257/40 |
| 2010/0028681 A1* | 2/2010 | Dai et al. | 428/408 |
| 2010/0035093 A1* | 2/2010 | Ruoff et al. | 429/12 |
| 2010/0102299 A1* | 4/2010 | Murase et al. | 257/40 |
| 2010/0127269 A1* | 5/2010 | Daniel et al. | 257/66 |
| 2010/0129641 A1* | 5/2010 | Lopez et al. | 428/323 |
| 2010/0173134 A1* | 7/2010 | Khokhlov et al. | 428/174 |
| 2010/0237336 A1* | 9/2010 | Rinzler et al. | 257/40 |
| 2010/0283047 A1* | 11/2010 | Facchetti et al. | 257/40 |
| 2010/0315153 A1* | 12/2010 | Oksanen et al. | 327/535 |

FOREIGN PATENT DOCUMENTS

| | | |
|---|---|---|
| WO | 03/052841 A1 | 6/2003 |

OTHER PUBLICATIONS

Nina I. Kovtyukhova et al., Layer-by-Layer Assembly of Ultrathin Composite Films From Micron-Sized Graphite Oxide Sheets and Polycations, Chem. Mater., American Chemical Society, 1999, pp. 771-778.

Beng S. Ong et al., High-Performance Semiconducting Polythiophenes for Organic Thin-Film Transistors, Materials Design and Integration Laboratory, Xerox Research Centre of Canada, Mississauga, Ontario, Canada L5K 2LI, American Chemical Society, 2004, pp. 3378-3379, JACS Communications.

German Search Report for 10 2010 046 661 dated Oct. 12, 2011.

* cited by examiner

ELECTRONIC DEVICE

BACKGROUND

The present disclosure relates, in various embodiments, to compositions suitable for use in electronic devices, such as thin film transistors ("TFT"s), with improved performance characteristics, such as improved mobility. The compositions are used to form semiconducting layers that include an organic semiconductor and graphene.

Thin film transistors (TFTs) are fundamental components in modern-age electronics, including, for example, sensors, image scanners, memory devices, radio frequency identification tags, and electronic display devices. It is usually desired to make TFTs which have not only much lower manufacturing costs, but also appealing mechanical properties such as being physically compact, lightweight, flexible, and having enhanced performance characteristics. Organic thin film transistors (OTFTs) promise the above desired benefits.

OTFTs are generally composed of a supporting substrate, three electrically conductive electrodes (gate, source and drain electrodes), a channel semiconducting layer, and an electrically insulating gate dielectric layer separating the gate electrode from the semiconducting layer.

It is desirable to improve the performance of known OTFTs. One measure of performance is the charge carrier mobility of the semiconducting layer. The mobility is measured in units of $cm^2/V \cdot sec$, higher mobility is desired. Although the last two decades have seen significant increase in mobility for printable organic semiconductors such as polythiophenes and polythiophene derivatives, the mobility values level off at around $0.1$-$0.2$ $cm^2/V \cdot sec$, which limits the applications of OTFTs. Therefore, there is a need to develop new technologies to dramatically improve the mobility for broad applications.

BRIEF DESCRIPTION

The present disclosure is directed, in various embodiments, to electronic devices, such as a thin film transistor, with a dielectric layer and a semiconducting layer that provides improved performance. The semiconducting layer includes organic semiconductor/graphene composite materials. For example, in several embodiments, the semiconducting layer includes layers or striations of an organic semiconductor and graphene. In some embodiments, the semiconducting layer comprises alternating layers or striations of (i) an organic semiconductor; and (ii) graphene. In other embodiments, the semiconducting layer comprises graphene which is dispersed substantially throughout the semiconducting layer.

Disclosed in further embodiments is an electronic device comprising a semiconducting layer; the semiconducting layer comprising an organic semiconductor and graphene. The organic semiconductor and graphene may be organized into layers or striations. The organic semiconductor layers/striations may alternate with the graphene layers/striations, or they may be stratified with respect to each other.

The graphene can also be chemically modified. In embodiments, the graphene is modified with a conjugated group selected from the group consisting of thiophene-based oligomers and polymers, pyrenes, phthalocyanines, polyphenylvinylidenes, polyfluorenes, polycarbazoles, polyindolocarbazoles, polytriarylamines, and polyphenylenes.

The organic semiconductor may be a polythiophene of Formula (I):

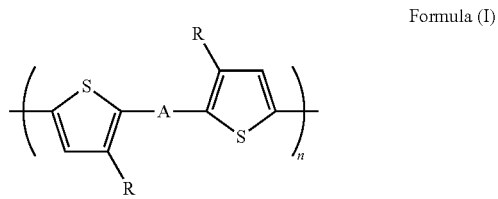

Formula (I)

wherein A is a divalent linkage; each R is independently selected from hydrogen, alkyl or substituted alkyl, aryl or substituted aryl, alkoxy or substituted alkoxy, a heteroatom-containing group, or halogen; and n is from 2 to about 5,000.

The divalent linkage can be selected from

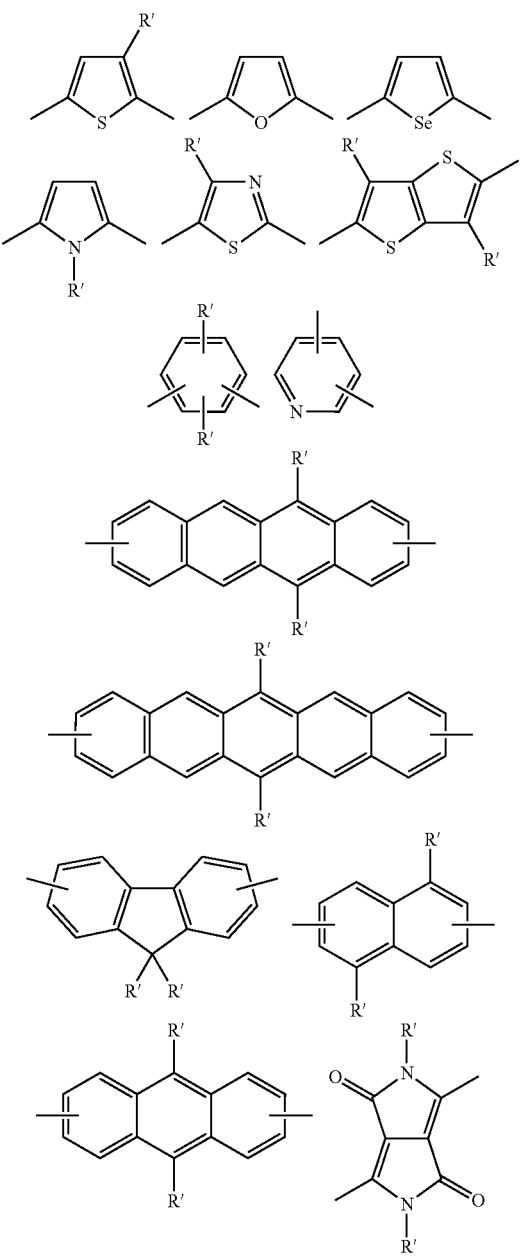

-continued

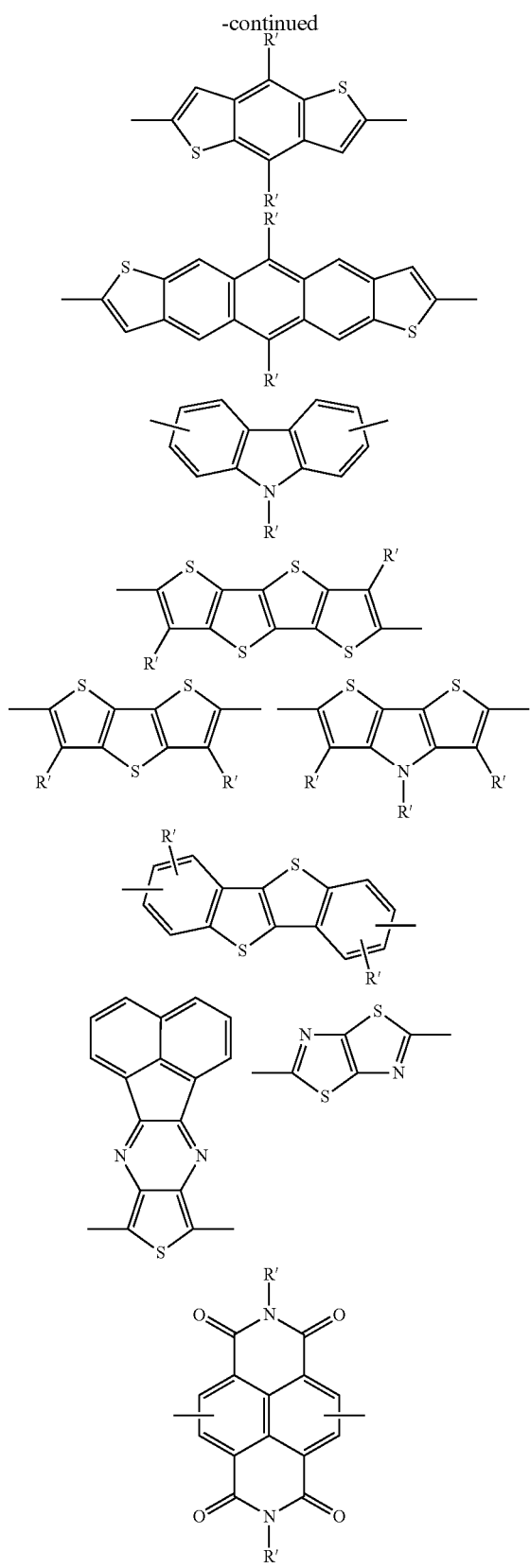

and combinations thereof, wherein each R' is independently selected from hydrogen, alkyl, substituted alkyl, aryl, substituted aryl, heteroaryl, halogen, —CN, or —NO$_2$.

In particular versions, the organic semiconductor is a polythiophene of Formula (II), (III), (IV), (V), (VI), (VII), or (VIII):

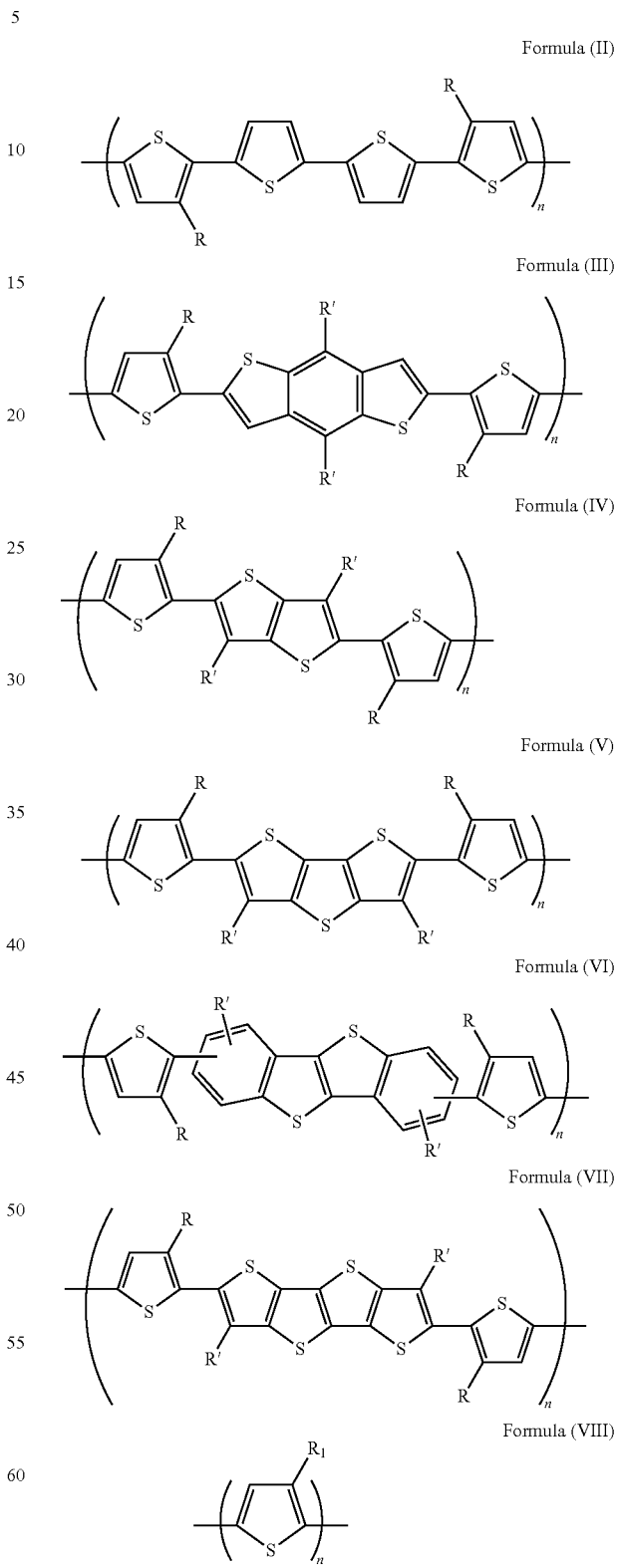

wherein each R, R', and R$_1$ is independently selected from hydrogen, alkyl or substituted alkyl, aryl or substituted aryl, alkoxy or substituted alkoxy, a heteroatom-containing group, or halogen; and n is from 2 to about 5,000.

Each graphene layer or striation may have functional sites, such as carbonyl groups, carboxylic acid groups, epoxide groups, or hydroxyl groups. The semiconducting layer may comprise from about 0.001 to about 10 percent by weight of the graphene, including from about 0.01 to about 5 weight percent graphene. The graphene layer may further comprise graphite oxide.

A graphene layer/striation can be made by depositing graphite oxide and reducing the graphite oxide to form the graphene layer/striation.

Alternatively, a graphene layer/striation can be made by dispersing graphite oxide in an aqueous solution comprising water and ammonia; converting the graphite oxide to graphene; dispersing the aqueous solution in an aprotic solvent and neutralizing any static charge; dispersing the graphene in an organic solvent; and depositing the organic solvent on a surface to form a graphene layer.

The semiconducting layer could also be made by forming a homogeneous suspension of the organic semiconductor and graphene oxide; depositing the suspension on a surface; and converting the graphene oxide to graphene.

Alternatively, the semiconductor layer could be made by a process comprising: heating the graphite to form graphene; dispersing the graphene into a graphene dispersion; mixing the graphene dispersion with an organic semiconductor to form a mixture; and depositing the mixture on a surface of a substrate to form the semiconducting layer.

Alternatively, the semiconducting layer could be made by a process comprising: dispersing graphite oxide in an aqueous solution comprising water and ammonia; converting the graphite oxide to graphene; dispersing the aqueous solution in an aprotic solvent and neutralizing any static charge; dispersing the graphene in an organic solvent to form a graphene dispersion; mixing the graphene dispersion with an organic semiconductor to form a mixture; and depositing the mixture on a surface of a substrate to form the semiconducting layer.

Disclosed in other embodiments is an electronic device comprising a semiconducting layer; the semiconducting layer comprising a first layer and a second layer; the first layer comprising an organic semiconductor; and the second layer comprising graphene. The organic semiconductor may comprise a majority of the first layer, and the graphene may comprise a majority of the second layer.

In embodiments, the first layer does not contain graphene. In other embodiments, the second layer does not contain an organic semiconductor.

The electronic device may further comprise a third layer, the third layer comprising an organic semiconductor; the second layer being located between the first layer and the third layer.

Also disclosed in embodiments is an electronic device comprising a semiconducting layer, the semiconducting layer comprising an organic semiconductor and graphene. The organic semiconductor and graphene may be stratified with respect to each other.

Also disclosed in embodiments is an electronic device comprising a semiconducting layer, the semiconducting layer comprising an organic semiconductor and graphene. The graphene is dispersed substantially throughout the semiconducting layer.

The graphene can form a percolation network within the semiconductor semiconducting layer. The graphene concentration in the semiconducting layer can be lower than the critical concentration for a percolation network.

Also disclosed is a process for forming a semiconducting layer on a substrate, comprising forming at least one organic semiconductor layer and at least one graphene layer upon a substrate.

The graphene layer may be formed by depositing graphite oxide and reducing the graphite oxide to form the graphene layer.

The organic semiconductor layer and the graphene layer could also be self-assembled by: dispersing graphite oxide in an aqueous solution comprising water and ammonia; converting the graphite oxide to graphene; dispersing the aqueous solution in an aprotic solvent and neutralizing any static charge; dispersing the graphene in an organic solvent to form a graphene dispersion; mixing the graphene dispersion with an organic semiconductor to form a mixture; and depositing the mixture upon the substrate to form at least one organic semiconductor layer and at least one graphene layer.

The organic semiconductor layer and the graphene layer could also be formed by forming a homogeneous suspension of the organic semiconductor and graphene oxide; converting the graphene oxide to graphene; and depositing the suspension on a surface of the substrate to form at least one organic semiconductor layer and at least one graphene layer.

These and other non-limiting characteristics of the exemplary embodiments of the present disclosure are more particularly described below.

BRIEF DESCRIPTION OF THE DRAWINGS

The following is a brief description of the drawings, which are presented for the purpose of illustrating the exemplary embodiments disclosed herein and not for the purpose of limiting the same.

DETAILED DESCRIPTION

Figure 1:
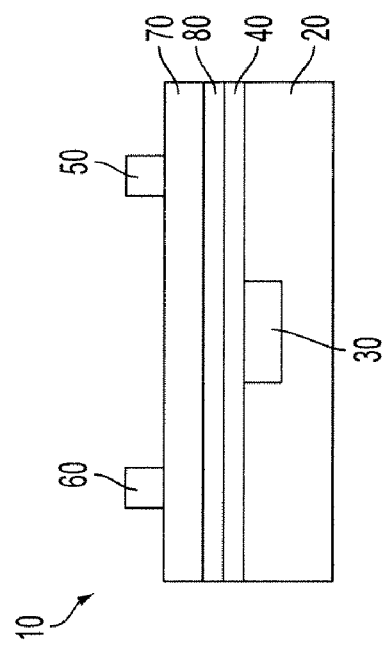
FIG. 1 is an exemplary embodiment of an OTFT of the present disclosure.

A more complete understanding of the components, processes, and devices disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

FIG. 1 illustrates a first organic thin film transistor (OTFT) embodiment or configuration. The OTFT 10 comprises a substrate 20 in contact with the gate electrode 30 and a dielectric layer 40. Although here the gate electrode 30 is depicted within the substrate 20, this is not required. However, of some importance is that the dielectric layer 40 separates the gate electrode 30 from the source electrode 50, drain electrode 60, and the semiconducting layer 70. The source electrode 50 contacts the semiconducting layer 70. The drain electrode 60 also contacts the semiconducting layer 70. The semiconducting layer 70 runs over and between the source and drain electrodes 50 and 60. An optional interfacial layer 80 is located between dielectric layer 40 and semiconducting layer 70.

Figure 2:
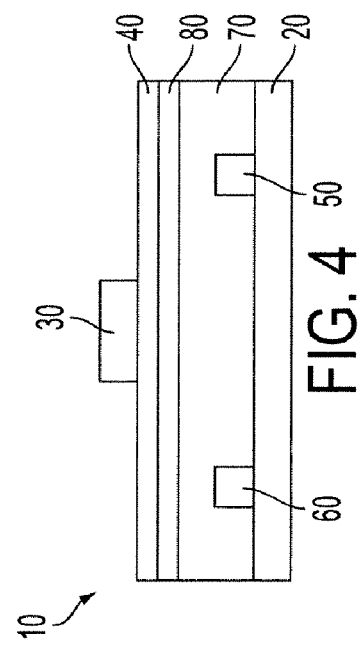
FIG. 2 is a second exemplary embodiment of an OTFT of the present disclosure.

FIG. 2 illustrates a second OTFT embodiment or configuration. The OTFT 10 comprises a substrate 20 in contact with the gate electrode 30 and a dielectric layer 40. The semiconducting layer 70 is placed over or on top of the dielectric layer 40 and separates it from the source and drain electrodes 50 and 60. Optional interfacial layer 80 is located between dielectric layer 40 and semiconducting layer 70.

Figure 3:
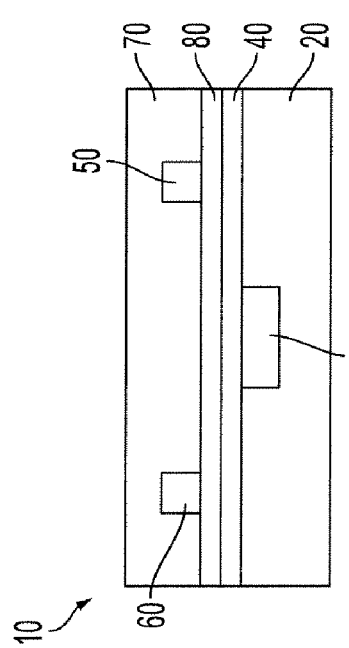
FIG. 3 is a third exemplary embodiment of an OTFT of the present disclosure.

FIG. 3 illustrates a third OTFT embodiment or configuration. The OTFT 10 comprises a substrate 20 which also acts as the gate electrode and is in contact with a dielectric layer 40. The semiconducting layer 70 is placed over or on top of the dielectric layer 40 and separates it from the source and drain electrodes 50 and 60. Optional interfacial layer 80 is located between dielectric layer 40 and semiconducting layer 70.

Figure 4:
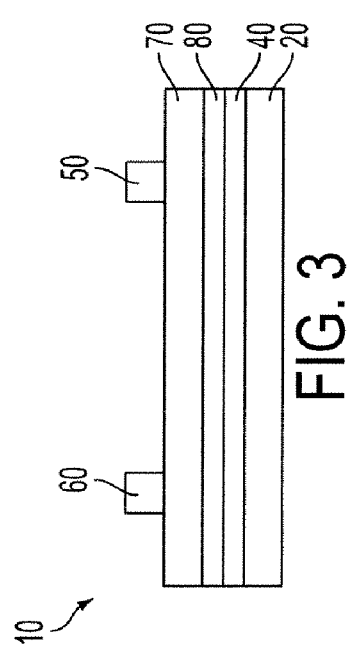
FIG. 4 is a fourth exemplary embodiment of an OTFT of the present disclosure.

FIG. 4 illustrates a fourth OTFT embodiment or configuration. The OTFT 10 comprises a substrate 20 in contact with the source electrode 50, drain electrode 60, and the semiconducting layer 70. The semiconducting layer 70 runs over and between the source and drain electrodes 50 and 60. The dielectric layer 40 is on top of the semiconducting layer 70. The gate electrode 30 is on top of the dielectric layer 40 and does not contact the semiconducting layer 70. Optional interfacial layer 80 is located between dielectric layer 40 and semiconducting layer 70.

In embodiments, the semiconducting layer contains an organic semiconductor and graphene. The organic semiconductor and graphene self-assemble so that the semiconducting layer is stratified, i.e. the organic semiconductor and graphene are in different portions of the semiconducting layer.

In other embodiments, the semiconducting layer is formed from one or more series of sublayers, i.e. layered structures. For example, there may be two alternating sets of sublayers. The first set of sublayers is formed from an organic semiconductor. The second set of sublayers is formed from graphene. Put another way, in certain structures, the organic semiconductor layers and graphene layers are arranged in an alternating pattern. The term "alternating" refers to the fact that at least one graphene layer is between two organic semiconductor layers and that at least one organic semiconductor layer is between two graphene layers. For example, where A denotes an organic semiconductor layer and B denotes a graphene layer, an -A-B-A-B-A-pattern, an -A-A-B-B-A-A-B-B-A-A- pattern, and an -A-B-B-A-B-A-B-B-A- pattern would all be considering alternating sets or alternating patterns of the two sets of sublayers.

In other embodiments, the semiconducting layer comprises a first layer, a second layer, and optionally a third layer. The second layer is between the first and third layers. The first layer and third layer comprise the organic semiconductor, and the second layer comprises graphene. In some embodiments, the second layer directly contacts the two layers, i.e. is adjacent to both the first and third layers, i.e. in an -A-B-A-B-A pattern.

Figure 5:
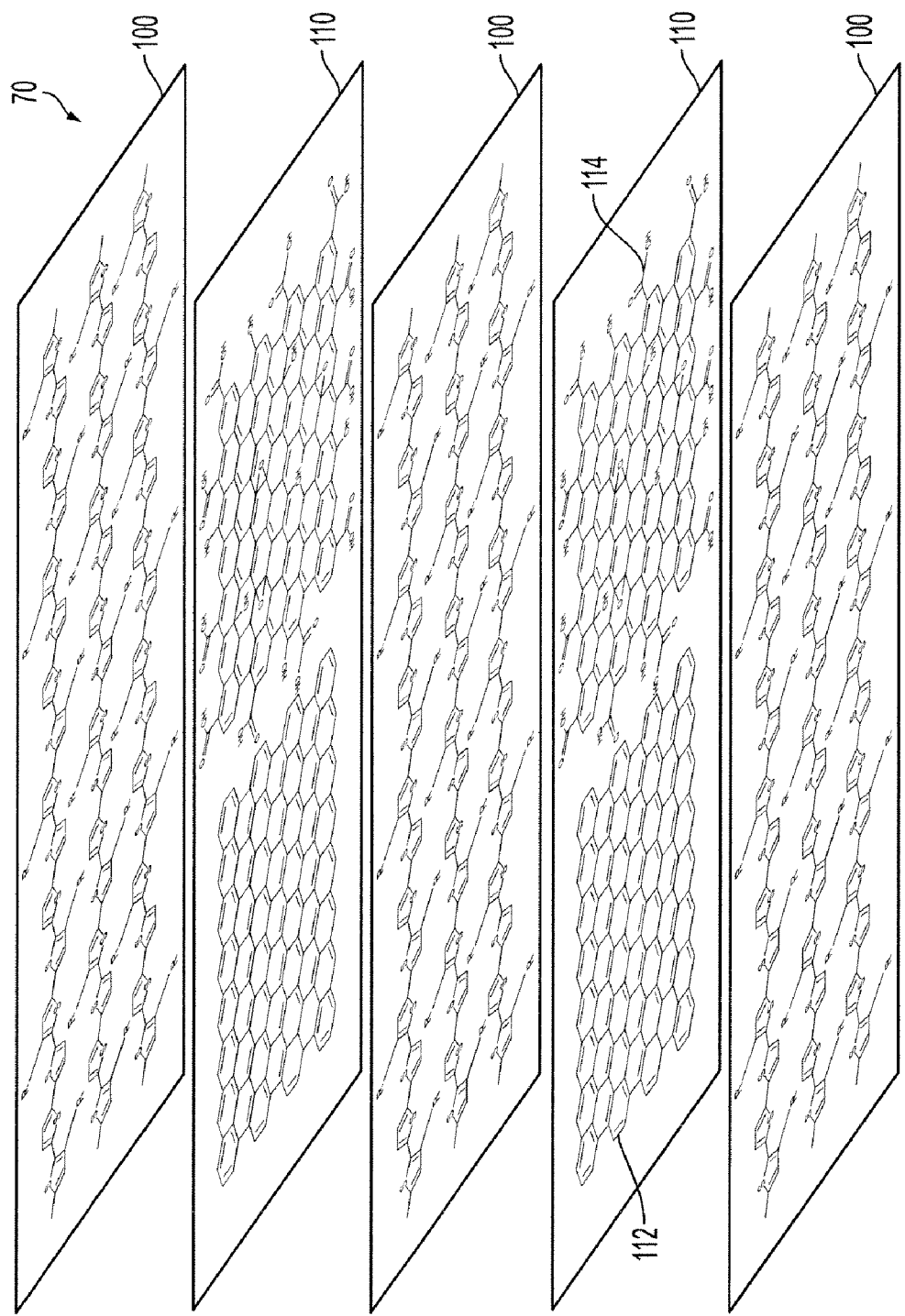
FIG. 5 is an exploded view of a semiconducting layer.

The arrangement of these layers can be seen in FIG. 5. Organic semiconductor layers 100 and graphene layers 110 are shown in an exploded view of the semiconducting layer 70.

Figure 6:
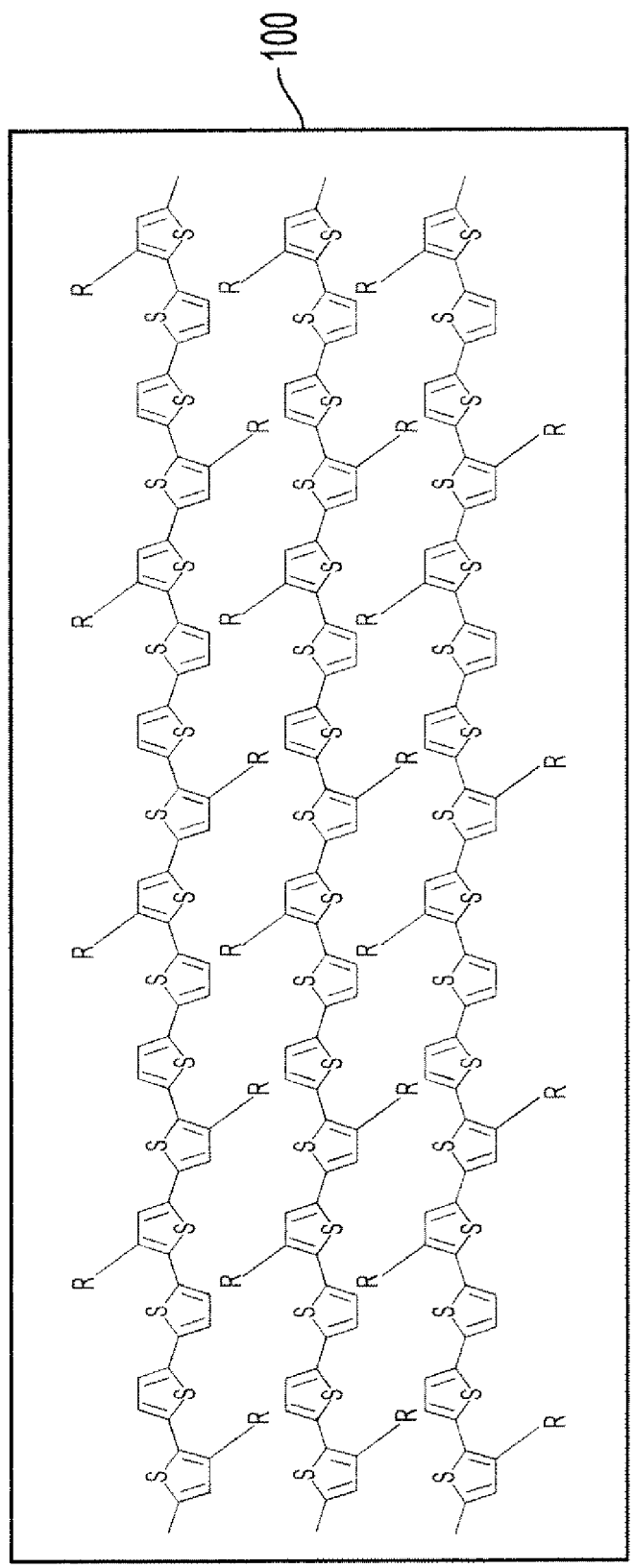
FIG. 6 is a top view of an organic semiconductor-containing layer in the semiconducting layer of the present disclosure.
Figure 7:
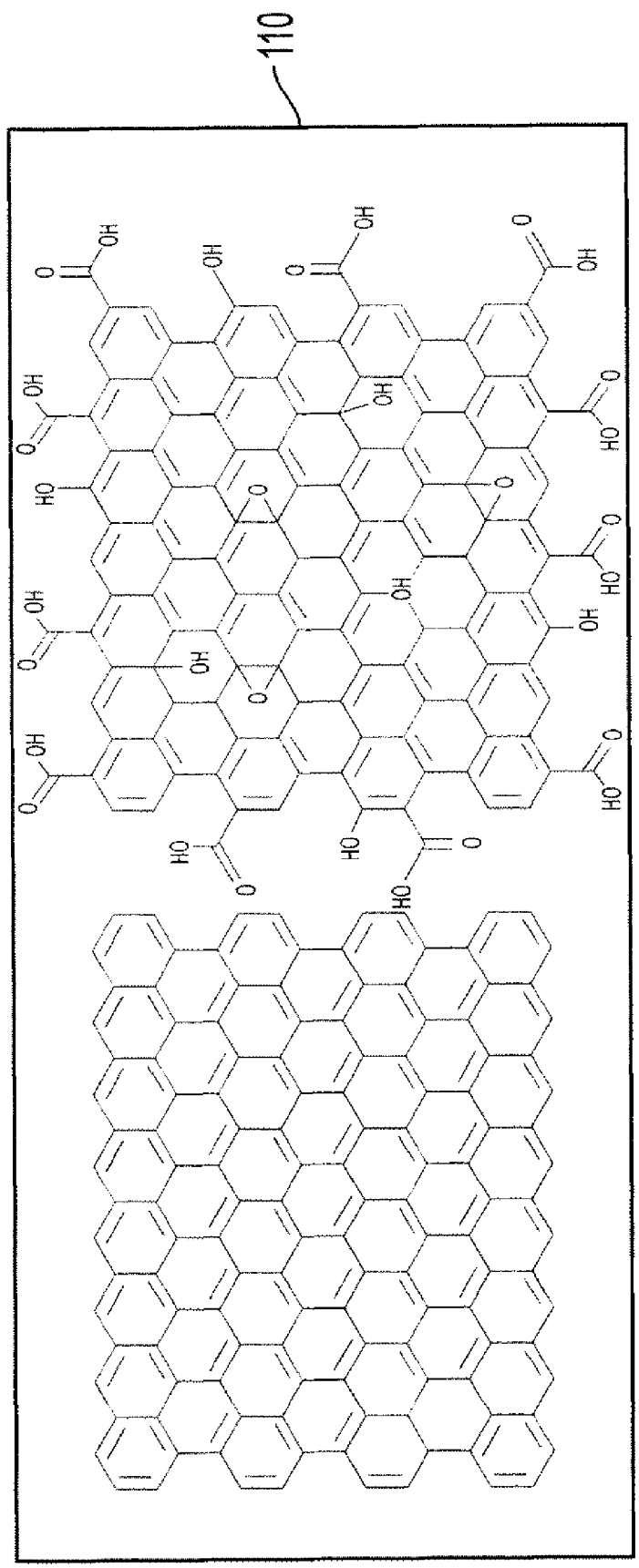
FIG. 7 is a top view of a graphene-containing layer in the semiconducting layer of the present disclosure.

FIG. 6 is a top view of the organic semiconductor layer 100. FIG. 7 is a top view of the graphene layer 110. Depicted in graphene layer 110 are two types of graphene plates 112 and 114. Graphene plate 112 represents pure graphene, while graphene plate 114 represents graphene that is formed by the reduction of graphite oxide and has oxygen-containing functional sites.

Figure 10:
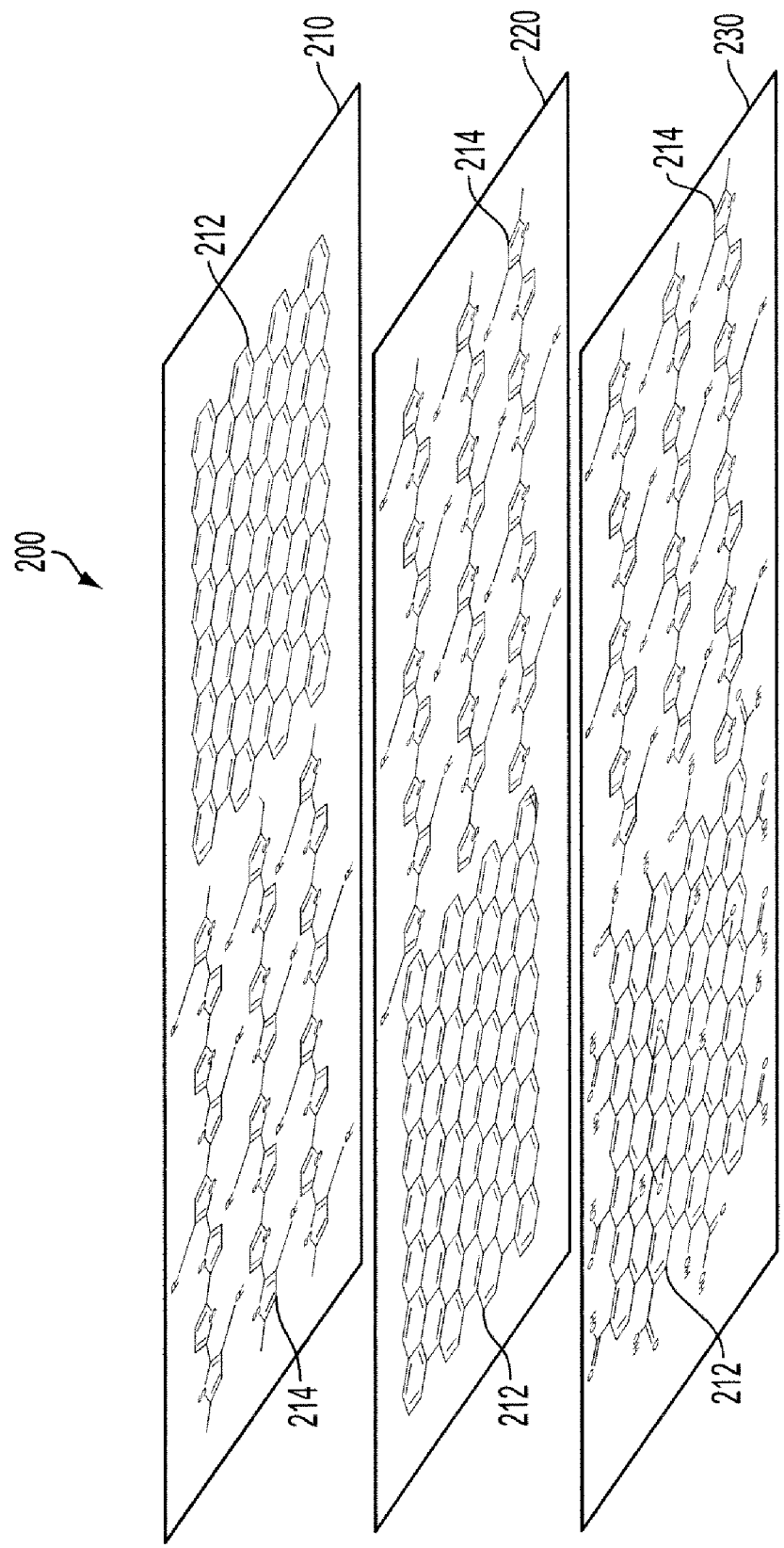
FIG. 10 is an illustration of a semiconducting layer having striations of organic semiconductor and graphene.

As mentioned, the organic semiconductor and graphene are in different portions of the semiconducting layer. It should be understood that the organic semiconductor/graphene do not need to make up the entirety of the layers/sublayers they are in. For example, as seen in FIG. 10, the semiconducting layer 200 has layers/striations of organic semiconductor and graphene. Portions of sublayer 210 contain graphene 212, while other portions of that sublayer contain organic semiconductor 214. Those portions or domains of different materials in each sublayer may not be evenly distributed between sublayers, as seen in the difference between sublayers 210, 220, and 230. However, in additional versions, the layers of the semiconducting layer that contain the organic semiconductor do not contain graphene, and the layers of the semiconducting layer that contain graphene do not contain the organic semiconductor. In additional versions, the organic semiconductor layers consist of the organic semiconductor, and/or the graphene layers consist of graphene.

The organic semiconductor is typically a majority of the overall semiconducting layer. Similarly, the organic semiconductor is generally a majority of each organic semiconductor layer, and the graphene is generally a majority of each graphene layer. The term "majority" means greater than 50 weight percent of the relevant layer, including from about 55 to about 99 weight percent, or in further embodiments from about 70 to about 95 weight percent.

In some embodiments, the organic semiconductor is a p-type organic semiconductor. In some embodiments, the organic semiconductor is an n-type semiconductor. In other embodiments, the organic semiconductor is an ambipolar semiconductor (both p and n-types).

In some embodiments, the organic semiconductor is a small molecular compound. Exemplary small molecular compounds include pentacene and pentacene derivatives (pentacene precursors and pentacene analogs), oligothiophenes, phthalocyanines, naphthalene-bisimides, and other fused-ring aromatic compounds.

The organic semiconductor may be, in some embodiments, an organic semiconducting polymer. In some embodiments, the organic semiconductor used in the semiconducting layer is a polythiophene of Formula (I):

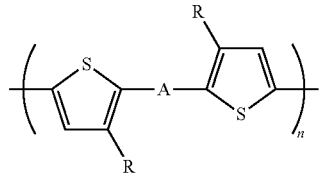

Formula (I)

wherein A is a divalent linkage; each R is independently selected from hydrogen, alkyl, substituted alkyl, aryl, substituted aryl, alkoxy or substituted alkoxy, a heteroatom-containing group, halogen, —CN, or —NO₂; and n is from 2 to about 5,000. In some embodiments, R is not hydrogen.

The term "alkyl" refers to a radical composed entirely of carbon atoms and hydrogen atoms which is fully saturated and of the formula $C_nH_{2n+1}$. The term "aryl" refers to an aromatic radical composed entirely of carbon atoms and hydrogen atoms. The term "alkoxy" refers to an alkyl radical which is attached to an oxygen atom.

The substituted alkyl, substituted aryl, and substituted alkoxy groups can be substituted with, for example, alkyl, halogen, —CN, and —NO₂. An exemplary substituted alkyl group is a perhaloalkyl group, wherein one or more hydrogen atoms in an alkyl group are replaced with halogen atoms, such as fluorine, chlorine, iodine, and bromine. The term "heteroatom-containing group" refers to a radical which is originally composed of carbon atoms and hydrogen atoms that forms a linear backbone, a branched backbone, or a cyclic backbone. This original radical is saturated or unsaturated. One or more of the carbon atoms in the backbone is then replaced by a heteroatom, generally nitrogen, oxygen, or sulfur, to obtain a heteroatom-containing group. The term "heteroaryl" refers generally to an aromatic compound containing at least one heteroatom replacing a carbon atom, and may be considered a subset of heteroatom-containing groups.

In particular embodiments, both R groups are alkyl having from about 6 to about 18 carbon atoms. In certain desirable examples, both R groups are the same. In further desired embodiments, both R groups are alkyl, particularly —C₁₂H₂₅.

The divalent linkage A forms a single bond to each of the two thienyl moieties in Formula (I). Exemplary divalent linkages A include:

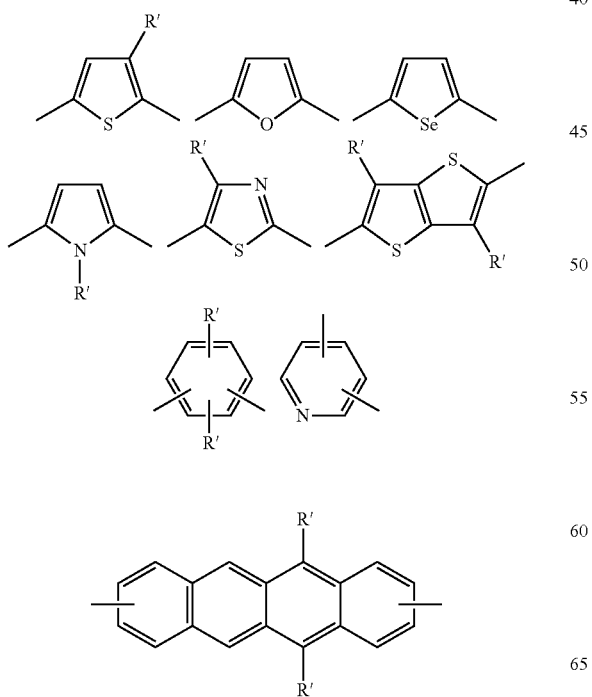

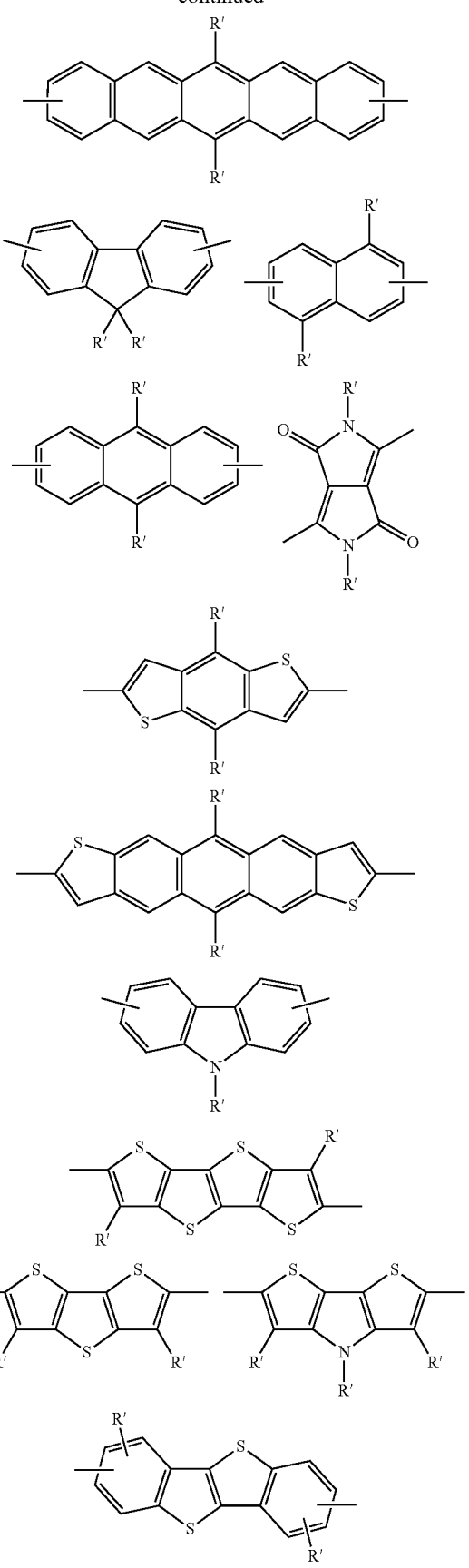

-continued

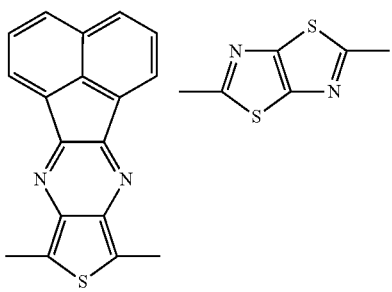

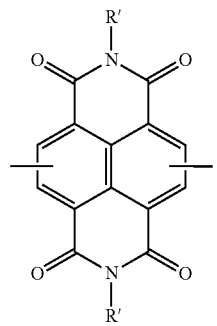

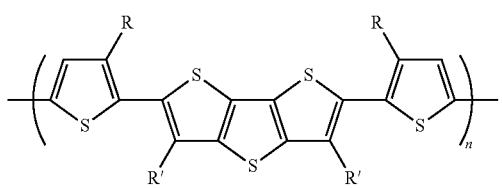

Formula (V)

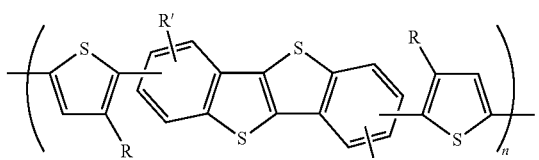

Formula (VI)

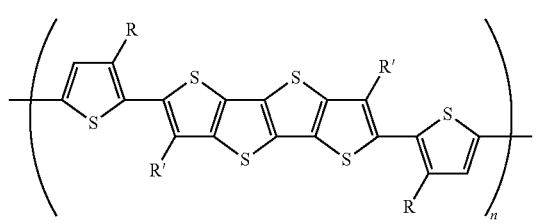

Formula (VII)

and combinations thereof, wherein each R' is independently selected from hydrogen, alkyl, substituted alkyl, aryl, substituted aryl, alkoxy or substituted alkoxy, a heteroatom-containing group, halogen, —CN, or —NO$_2$. It should be noted that the divalent linkage A will always be different from the two thiophene monomers shown in Formula (I); in other words, Formula (I) will not reduce to being a polythiophene made from only one monomer.

In particular embodiments, the organic semiconductor is a polythiophene of Formula (II), (III), (IV), (V), (VI), or (VII):

Formula (II)

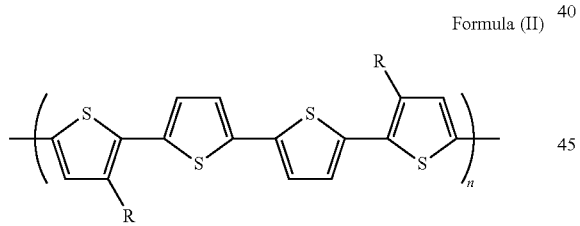

Formula (III)

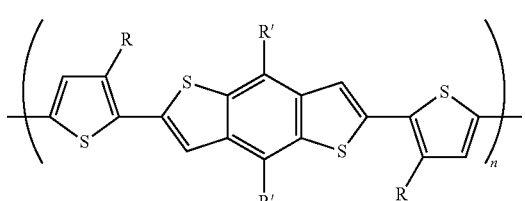

Formula (IV)

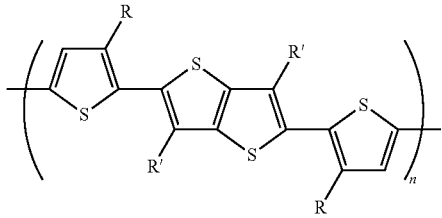

wherein each R and R' is independently selected from hydrogen, alkyl or substituted alkyl, aryl or substituted aryl, alkoxy or substituted alkoxy, a heteroatom-containing group, or halogen; and n is an integer from about 2 to about 5,000. In particular embodiments, the polythiophene is of Formula (II) and each R is alkyl.

In other embodiments, the organic semiconductor is a polythiophene of Formula (VIII):

Formula (VIII)

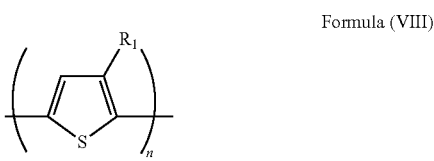

wherein $R_1$ is selected from hydrogen, alkyl or substituted alkyl, aryl or substituted aryl, alkoxy or substituted alkoxy, a heteroatom-containing group, or halogen; and n is an integer from about 2 to about 5,000.

When R or R' are alkyl, alkoxy, aryl, or their substituted derivatives thereof, they may contain from 1 to about 35 carbon atoms, or from about 1 to about 30 carbon atoms, or from about 1 to about 20 carbon atoms, or from about 6 to about 18 carbon atoms, inclusive of any side-chains. The variable n represents the number of repeating units, and may be a number from about 2 to about 5,000, about 2 to about 2,500, about 2 to about 1,000, about 100 to about 800, or from about 2 to about 100.

In specific embodiments, each R is independently an alkyl side-chain containing from about 6 to about 30 carbon atoms, and each R is independently selected an alkyl side-chain containing from 1 to about 5 carbon atoms. In other embodiments, each R is independently selected an alkyl side-chain containing from 0 to about 5 carbon atoms, and each R' is an alkyl side-chain containing from 6 to about 30 carbon atoms. In still other embodiments, R and R' are independently alkyl with about 1 to about 35 carbon atoms, or arylalkyl with about 7 to about 42 carbon atoms. Exemplary alkyl groups include methyl, ethyl, propyl, butyl, pentyl, hexyl, heptyl, octyl, nonyl, decyl, undecyl, dodecyl, tridecyl, tetradecyl, pentadecyl, hexadecyl, heptadecyl or octadecyl. Exemplary arylalkyl groups include methylphenyl(tolyl), ethylphenyl, propylphenyl, butylphenyl, pentylphenyl, hexylphenyl, heptylphenyl, octylphenyl, nonylphenyl, decylphenyl, undecylphenyl, dodecylphenyl, tridecylphenyl, tetradecylphenyl, pentadecylphenyl, hexadecylphenyl, heptadecylphenyl, and octadecylphenyl. In particular embodiments, R and R' are represent alkyl or substituted alkyl groups having from about 1 to about 35 carbon atoms.

In a specific embodiment, the R groups are identical to each other; and the R' groups are identical to each other. In other embodiments, the R and R' groups are identical to each other. In another specific embodiment, the R and R' substituents are identical alkyl groups having from about 6 to about 18 carbon atoms.

When the organic semiconductor is a polymer, it may have a weight average molecular weight of from about 1,000 to about 1,000,000, or from about 5000 to about 100,000.

The graphene layers in the semiconducting layer comprise graphene. Ideally, the term graphene refers to a one-atom-thick sheet of $sp^2$-bonded carbon atoms arranged in a honeycomb pattern, i.e. hexagonal cells. Graphene can also be considered a polycyclic aromatic hydrocarbon. The term "graphene" should not be considered as referring only to the hexagonal cell structure made exclusively of carbon atoms. For example, it is contemplated that certain substituents/functional groups may be attached to the hexagonal cells, as described further herein, or that precursors such as graphene oxide may also be present. In embodiments, the graphene is dispersed substantially throughout the semiconducting layer, i.e. throughout the length, width, and thickness of the semiconducting layer.

In some embodiments, a graphene layer may be a few sheets (e.g. from about 1 to about 10 or from about 1 to about 3 sheets) of $sp^2$-bonded carbon atoms arranged in a honeycomb pattern. In some embodiments, the graphene layers further comprise graphene oxide. Graphene oxide and graphite oxide both refer to a precursor of graphene.

Each graphene layer can be formed as one continuous sheet, or can be made up of several small sheets or plates of graphene. Several methods of making graphene are known. In particular, methods where graphene is formed from the reduction of graphite oxide are especially suitable for this application. One large advantage of using graphite oxide is that graphite oxide itself is easier to handle than graphene. For example, graphite oxide is easily dispersed in a solvent for liquid deposition processes. Also, graphite oxide itself is less conductive than graphene, so the overall conductivity of the graphene layer can be controlled by changing the ratio between graphite oxide and graphene by controlling the degree of reduction of the graphite oxide.

The resulting semiconducting layer will have increased mobility compared to a semiconducting layer lacking graphene. Without being bound by theory, it appears that certain synergistic effects result from the combination of an organic semiconductor with graphene. First, organic semiconductors, such as polythiophenes, often form large lamellar sheets, which further stack together and form pi-pi stacking arrays. Those lamellar sheets can be considered as two-dimensional one-atom-thick layers. Graphene also forms such layers, allowing the graphene layers to participate in the pi-pi stacking arrays. An illustrative diagram of such stacking is shown in FIG. 5, as described above. This structural similarity allows the graphene to enhance the pi-pi stacking of the organic semiconductor, such that a homogeneous organic semiconductor/graphene composite is expected. In contrast, carbon nanotubes have a rod-like structure which can disturb the packing of the organic semiconductor.

As a result of the compatible planar stacking between the organic semiconductor and the graphene, mobility can be increased in two aspects. Graphene can form a percolation network or near percolation network to improve apparent mobility by reducing the effective channel length. A percolation network is a connected structure that spans a non-minimal linear dimension of the entire semiconducting layer. Herein, a non-minimal linear dimension is a linear dimension of the layer that is not the layer's smallest linear dimension; in many cases, the layer thickness is the minimal dimension of the layer. The critical concentration for a percolation network, or percolation threshold, can be determined for example by measuring the conductance of a layer. Before the formation of a percolation network, the conductance of the layer is dominated by the conductance of the organic semiconductor. When the percolation network is formed, the conductance of the semiconducting layer is dominated by the graphene. Given the conductance difference between the graphene and the organic semiconductor, the percolation threshold can be determined. In embodiments, the concentration of graphene in the semiconducting layer is less than the critical concentration for a percolation network. It is should be noted that the percolation threshold will vary depending on the composition of the semiconducting layer. When a different organic semiconductor is used, a different percolation threshold may be observed. At concentrations below the percolation threshold, the graphene does not form a conducting or semiconducting network that could short-circuit the organic semiconductor matrix.

Figure 8:
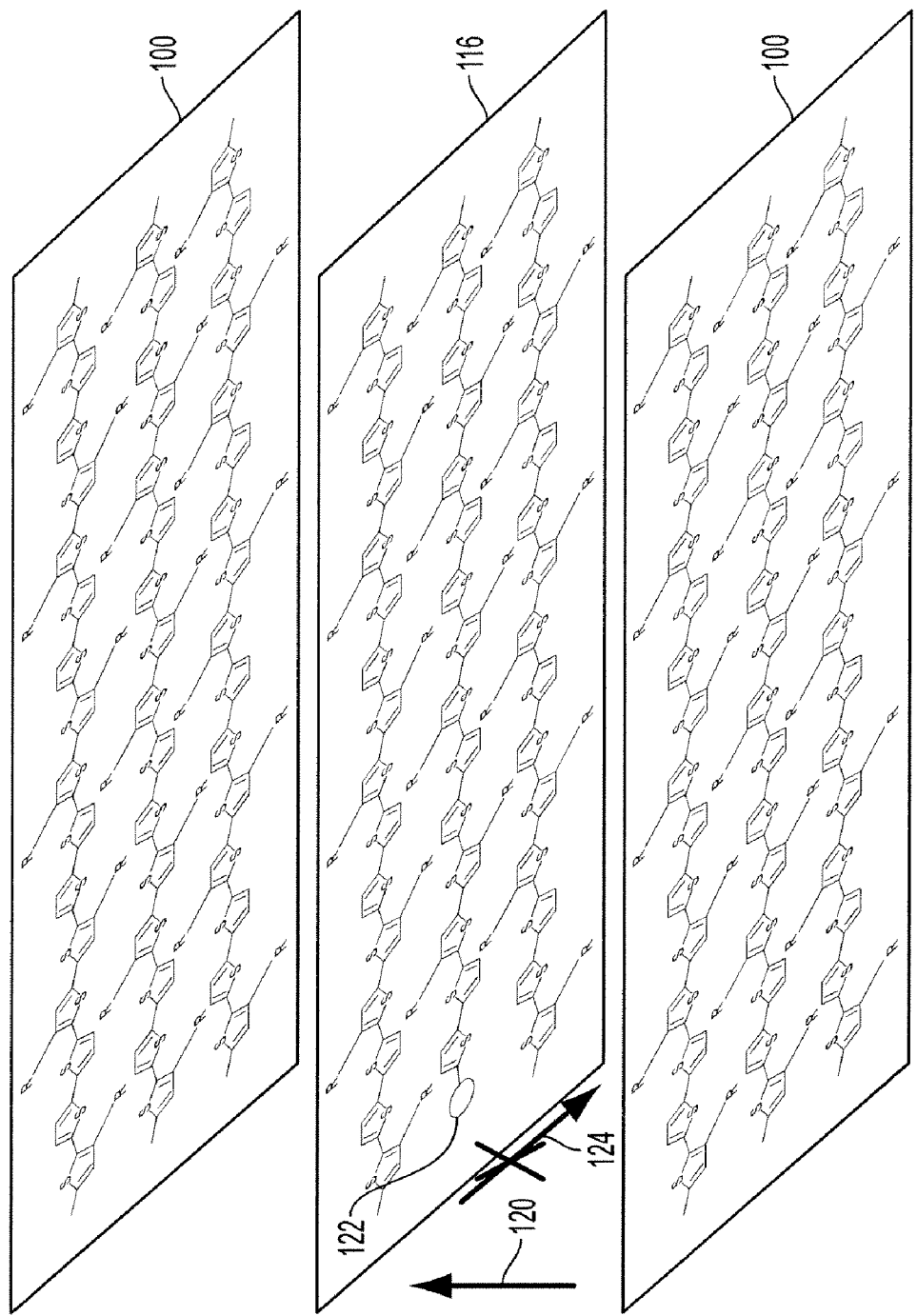
FIG. 8 is an illustration of slowed charge transfer in a semiconducting layer lacking graphene.
Figure 9:
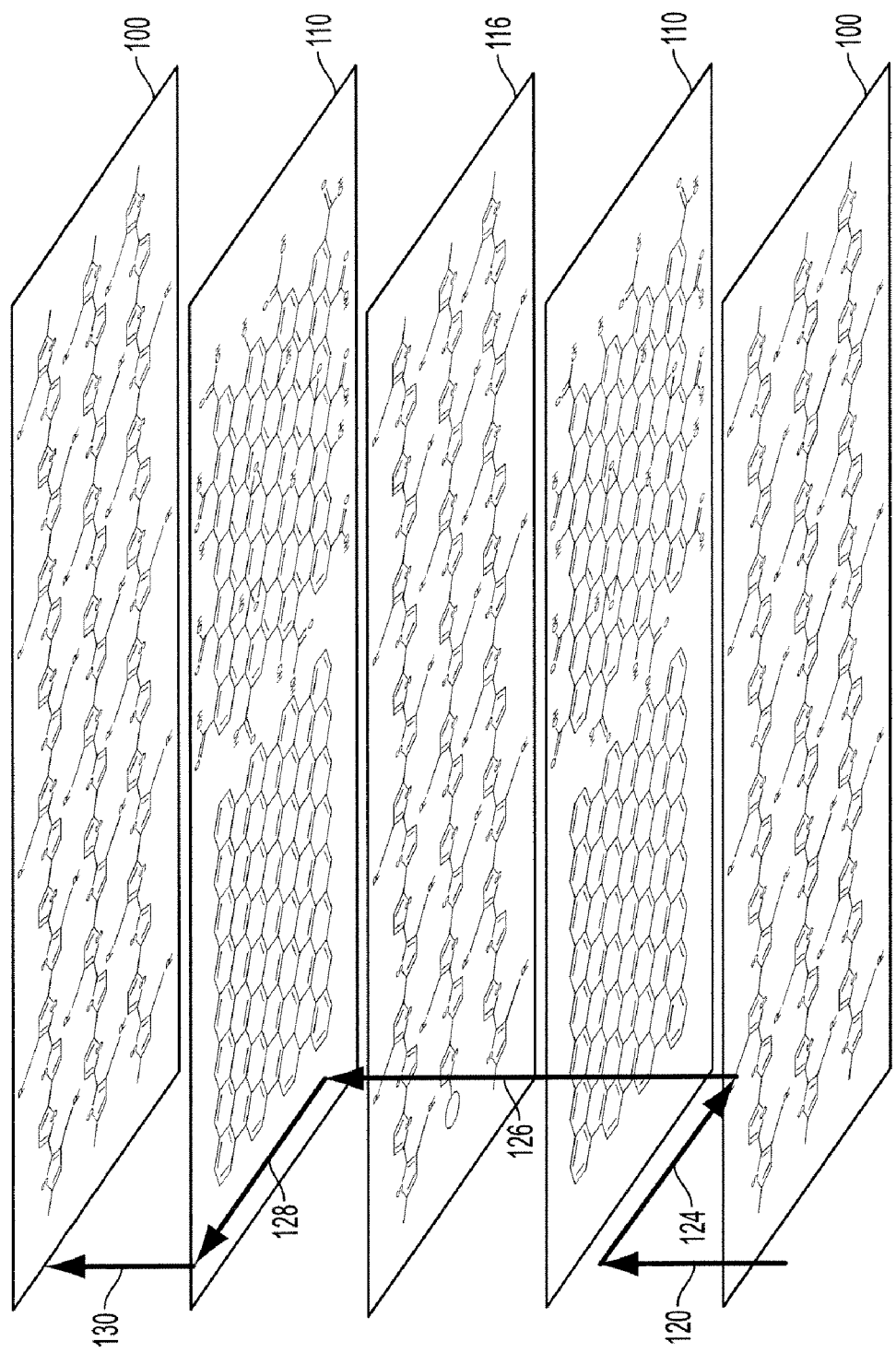
FIG. 9 is an illustration of charge transfer in a semiconducting layer containing graphene.

More important, since the graphene sheets participate in the pi-pi stacking of the organic semiconductor, it can dramatically increase the inter-layer charge transfer mobility. For example, the presence of the graphene layers allow for correction of any defects in the pi-pi stacking array from the organic semiconductor by providing additional paths for charge transfer. For example, as shown in FIG. 8, the semiconducting layer contains lamellar layers 100 formed from the organic semiconductor, but lacking graphene. A defect 122 (represented by a circle) in an organic semiconductor layer 116 significantly slows down the charge transfer (represented by arrow 120) through the semiconducting layer because the current can only flow through the stacked aromatic thienyl groups and not through the R groups (represented by arrow 124). However, if graphene layers 110 are incorporated as in FIG. 9, they provide a path for interlayer transfer, allowing electrons or holes to pass around the defect, as represented by arrows 120, 124, 126, 128, 130.

Second, the conductivity of the graphene layers can be controlled from highly conductive to semiconductive depending on the method by which the graphene layer is formed. For example, one method of forming a graphene layer occurs by depositing graphite oxide, then reducing the graphite oxide to graphene through the application of heat. Graphite oxide is less conductive than graphene, so the ratio of graphene to graphite oxide changes the conductivity of the graphene layer, and that ratio is easily controlled by varying the amount of heat applied. In contrast, carbon nanotubes are always a mixture of conductive and semiconductive nanotubes, so that the conductivity cannot be easily controlled.

Additionally, the graphene and the organic semiconductor are both very flexible, allowing flexible electronic devices to be made. Graphene is also cost-effective when compared to carbon nanotubes.

Graphene sheets or plates generally can be modified to create functional sites on various carbon atoms, both on the edges of the sheet/plate and on internal carbon atoms as well. For example, it is known that graphene can be treated to obtain oxygen-containing functional groups such as carbonyl, carboxylic acid, epoxide, and hydroxyl groups at functional sites. In some embodiments, these functional groups are modified by grafting other moieties to the graphene sheet. As another example, the graphene can be chemically modified with a conjugated group selected from the group consisting of thiophene-based oligomers and polymers, pyrenes, phthalocyanines, polyphenylvinylidenes, polyfluorenes, polycarbazoles, polyindolocarbazoles, polytriarylamines, and polyphenylenes.

The semiconducting layer can be made in several different ways. For example, one approach is to briefly heat graphite (e.g. to a temperature of 1000° C., including from about 850° C. to about 1200° C.) in a forming gas, such as 3% hydrogen in argon, to exfoliate the graphite and obtain graphene. The graphene can be dispersed in a solvent along with the organic semiconductor and sonicated to obtain a homogeneous dispersion. The dispersion is then deposited upon a substrate and dried to form the semiconducting layer.

Another approach to forming the semiconducting layer is to disperse graphite oxide in a mixture of water (i.e. aqueous solution) and ammonia ($NH_3$) by simple sonication. This results in a stable dispersion due to electrostatic stabilization. See *Nature Nanotechnology*, 2008, vol. 3, pp. 101-105). The graphite oxide can then be converted to graphene by reduction. The aqueous graphene dispersion can be stabilized with a surfactant which is already present or is added after conversion to graphene. The graphene can then be re-dispersed in an aprotic solvent, such as DMF acetone, THF, acetate, ether, and the like. After neutralizing any remaining static charge, the hydrophobic graphene can be re-dispersed in a common organic solvent, such as toluene, chlorobenzene, dichlorobenzene, xylene, mesitylene, chloroethane, chloromethane, and the like and deposited on a substrate. This approach forms a graphene layer. The organic semiconductor layer can be deposited via a different solution comprising the organic semiconductor and a solvent.

Another approach is to disperse graphite oxide and the organic semiconductor together in a solvent to form a deposition solution. The two components are then deposited to form a thin film. The graphite oxide can then be reduced to graphene in situ, for example by exposure to hydrazine vapor and mild heating simultaneously. Alternatively, graphene can be formed as described above and then dispersed in an organic solvent to form a graphene dispersion. This dispersion is then mixed with an organic semiconductor to form a mixture. The mixture is then deposited on a substrate to form the semiconducting layer.

It should be noted that when the graphene and organic semiconductor are simultaneously deposited, they can self-assemble to form separate layers due to their different structures. The R groups of the organic semiconductor, such as in the polythiophenes of Formulas (I) and (II), pack well together, while the graphene sheets/plates pack well together.

If desired, the semiconducting layer may comprise other organic semiconductor materials. However, it is generally contemplated that the semiconducting layer is formed solely with the organic semiconductor/graphene layers. Alternatively, the semiconducting layer can be considered a composite. The graphene layers can comprise from about 0.001 to about 10 weight percent of the semiconducting layer, including from about 0.01 to about 5 weight percent. In other versions, the organic semiconductor layers comprise from about 90 to about 99.999 weight percent of the semiconducting layer.

The semiconducting layer is from about 5 nm to about 1000 nm thick, especially from about 10 nm to about 100 nm thick. The semiconducting layer can be formed by any suitable method. However, the semiconducting layer is generally formed from a liquid composition(s), such as a dispersion or solution, and then deposited onto a substrate of the transistor. Exemplary deposition methods include liquid deposition such as spin coating, dip coating, blade coating, rod coating, screen printing, offset printing, stamping, ink jet printing, and the like, and other conventional processes known in the art.

The semiconducting layer of the present disclosure, comprising graphene, can be used in electronic devices. Exemplary electronic devices include thin film transistors, photovoltaic cells, sensors, memory, and light emitting diodes.

The substrate may be composed of materials including but not limited to silicon, glass plate, plastic film or sheet. For structurally flexible devices, plastic substrate, such as for example polyester, polycarbonate, polyimide sheets and the like may be used. The thickness of the substrate may be from about 10 micrometers to over 10 millimeters with an exemplary thickness being from about 50 micrometers to about 5 millimeters, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite or silver colloids. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges from about 10 to about 500 nanometers for metal films and from about 0.5 to about 10 micrometers for conductive polymers.

The dielectric layer generally can be an inorganic material film, an organic polymer film, or an organic-inorganic composite film. Examples of inorganic materials suitable as the dielectric layer include silicon oxide, silicon nitride, aluminum oxide, barium titanate, barium zirconium titanate and the like. Examples of suitable organic polymers include polyesters, polycarbonates, poly(vinyl phenol), polyimides, polystyrene, polymethacrylates, polyacrylates, epoxy resin and the like. The thickness of the dielectric layer depends on the dielectric constant of the material used and can be, for example, from about 10 nanometers to about 500 nanometers. The dielectric layer may have a conductivity that is, for example, less than about $10^{-12}$ Siemens per centimeter (S/cm). The dielectric layer is formed using conventional processes known in the art, including those processes described in forming the gate electrode.

If desired, an interfacial layer may be placed between the dielectric layer and the semiconducting layer. As charge transport in an organic thin film transistor occurs at the interface of these two layers, the interfacial layer may influence the TFT's properties. Exemplary interfacial layers may be formed from silanes, such as those described in U.S. patent application Ser. No. 12/101,942, filed Apr. 11, 2008.

Typical materials suitable for use as source and drain electrodes include those of the gate electrode materials such as gold, silver, nickel, aluminum, platinum, conducting polymers, and conducting inks. In specific embodiments, the electrode materials provide low contact resistance to the semiconductor. Typical thicknesses are about, for example, from about 40 nanometers to about 1 micrometer with a more specific thickness being about 100 to about 400 nanometers. The OTFT devices of the present disclosure contain a semiconductor channel. The semiconductor channel width may be, for example, from about 5 micrometers to about 5 millimeters with a specific channel width being about 100 micrometers to about 1 millimeter. The semiconductor channel length may be, for example, from about 1 micrometer to about 1 millimeter with a more specific channel length being from about 5 micrometers to about 100 micrometers.

The source electrode is grounded and a bias voltage of, for example, about 0 volt to about 80 volts is applied to the drain electrode to collect the charge carriers transported across the semiconductor channel when a voltage of, for example, about +10 volts to about −80 volts is applied to the gate electrode. The electrodes may be formed or deposited using conventional processes known in the art.

If desired, a barrier layer may also be deposited on top of the TFT to protect it from environmental conditions, such as light, oxygen and moisture, etc. which can degrade its electrical properties. Such barrier layers are known in the art and may simply consist of polymers.

The various components of the OTFT may be deposited upon the substrate in any order, as is seen in the Figures. The term "upon the substrate" should not be construed as requiring that each component directly contact the substrate. The term should be construed as describing the location of a component relative to the substrate. Generally, however, the gate electrode and the semiconducting layer should both be in contact with the dielectric layer. In addition, the source and drain electrodes should both be in contact with the semiconducting layer. The organic semiconductor formed by the methods of the present disclosure may be deposited onto any appropriate component of an organic thin-film transistor to form a semiconducting layer of that transistor.

The resulting transistor may have, in embodiments, a mobility of 0.2 cm$^2$/V·sec or greater.

The following examples illustrate electronic devices made according to the methods of the present disclosure. The examples are merely illustrative and are not intended to limit the present disclosure with regard to the materials, conditions, or process parameters set forth therein. All parts are percentages by weight unless otherwise indicated.

EXAMPLES

Example 1

A semiconducting polymer, PQT-12, poly(3,3'''-didodecylquaterthiophene), corresponding to Formula (II) where R=—C$_{12}$H$_{25}$, is used with commercially expandable graphite (160-50-N GRAFGUARD, available from GrafTech, Cleveland, Ohio) in this example. The graphite is first briefly heated to 1000° C. in forming gas of 3% hydrogen in argon for 60 seconds. The resulting exfoliated graphite is dispersed in a solution of PQT-12 in 1,2-dichlorobenzene by sonication for 30 minutes to form a homogeneous suspension. The graphene is from about 0.05 to 1.0 volume percent of the PQT-12. The suspension is filtered with a 1.0 μm glass filter and ready for depositing.

OTFTs using the above PQT/graphene composite are fabricated using the procedure disclosed in J. Am. Chem. Soc., 2004, 126, pp. 3378-3379.

Example 2

Graphite oxide is synthesized from natural graphite by a modified Hummers method described in Chem. Mater., 1999, 11, pp. 771-778. The synthesized graphite oxide is suspended in water to give a brown dispersion, which is subjected to dialysis to completely remove residual salts and acids. The purified graphite oxide is re-dispersed in ultrapure water. Exfoliation of graphite oxide to graphene oxide is achieved by sonication for 30 minutes. The homogenous dispersion is mixed with hydrazine solution and ammonia solution in a glass bottle. The mixture is heated to 95° C. for 1 hour to chemically convert graphene oxide to graphene.

A surfactant, 1,2-distearoyl-sn-glycero-3-phosphoethanolamine-N-[methoxy(polyethyleneglycol)-5000] is added to the dispersion. The graphene is centrifuged, collected, and redispersed in DMF. After repeating re-suspension and centrifugation several times in DMF to remove the surfactant, the aggregates are re-dispersed in 1,2-dichlorobenzene. PQT-12 semiconducting polymer is added to form a composite for OTFT fabrication.

The devices of the present disclosure have been described with reference to exemplary embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A thin-film transistor comprising a semiconducting layer, the semiconducting layer comprising an organic semiconductor and graphene; wherein the graphene concentration in the semiconducting layer is lower than the critical concentration for a percolation network.

2. A process for forming a semiconducting layer on a substrate, comprising stratifying at least one organic semiconductor with at least one graphene, wherein the semiconducting layer is formed by:
    dispersing graphite oxide in an aqueous solution comprising water and ammonia;
    converting the graphite oxide to graphene;
    dispersing the aqueous solution in an aprotic solvent and neutralizing any static charge;
    dispersing the graphene in an organic solvent to form a graphene dispersion;
    mixing the graphene dispersion with an organic semiconductor to form a mixture; and
    depositing the mixture upon the substrate.

3. A process for forming a semiconducting layer on a substrate, comprising stratifying at least one organic semiconductor with at least one graphene, wherein the semiconducting layer is formed by:
    forming a homogeneous suspension of the organic semiconductor and graphene oxide;
    depositing the suspension on a surface of the substrate; and
    converting the graphene oxide to graphene.

4. An electronic device comprising a semiconducting layer;
    the semiconducting layer comprising (i) an organic semiconductor and (ii) graphene;

wherein the organic semiconductor comprises a semiconducting polymer of Formula (I):

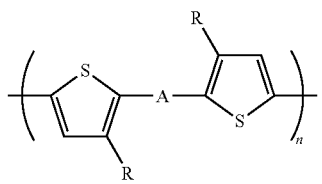

Formula (I)

wherein A is a divalent linkage; each R is independently selected from hydrogen, alkyl or substituted alkyl, aryl or substituted aryl, alkoxy or substituted alkoxy, a heteroatom-containing group, or halogen; and n is from 2 to about 5,000; and wherein the divalent linkage A is selected from:

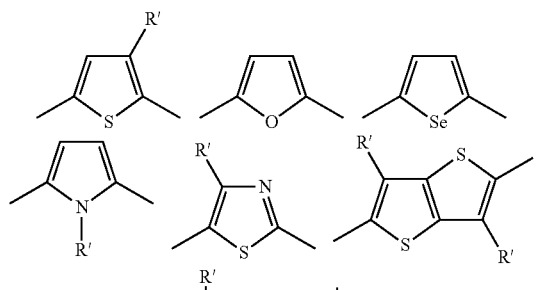

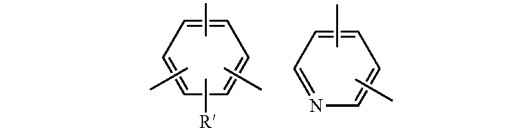

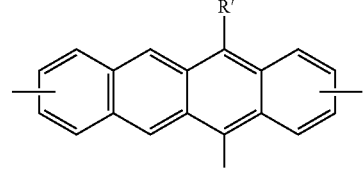

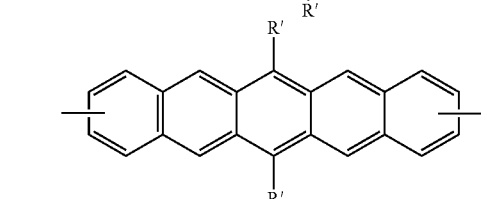

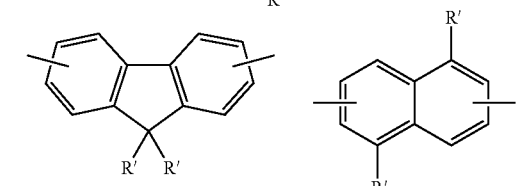

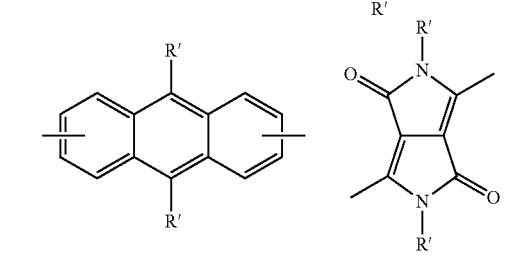

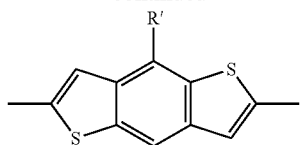

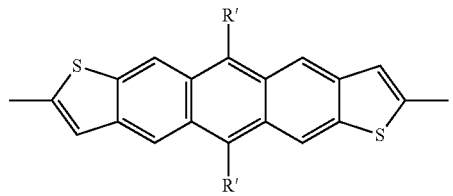

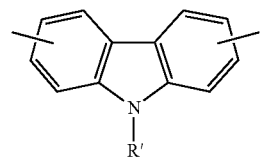

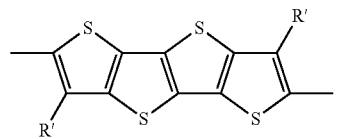

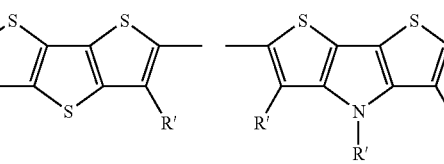

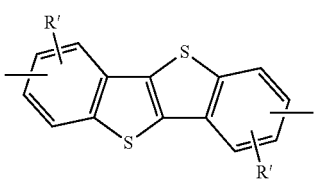

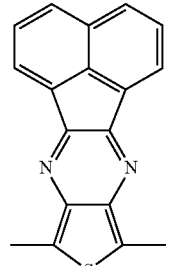

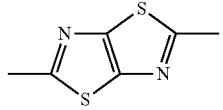

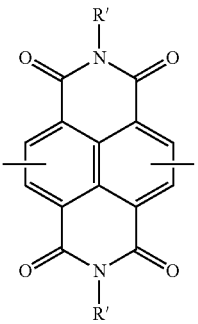

and combinations thereof, wherein each R' is independently selected from hydrogen, alkyl, substituted alkyl, aryl, substituted aryl, heteroaryl, halogen, —CN, or —NO$_2$.

* * * * *